United States Patent
Chen et al.

(10) Patent No.: US 10,020,325 B2
(45) Date of Patent: Jul. 10, 2018

(54) METHOD FOR PRODUCING TFT ARRAY SUBSTRATE, TFT ARRAY SUBSTRATE, AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Lei Chen, Beijing (CN); Zhilong Peng, Beijing (CN); Wukun Dai, Beijing (CN); Lei Zhang, Beijing (CN); Miao Qiu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/324,641

(22) PCT Filed: Jan. 27, 2016

(86) PCT No.: PCT/CN2016/072292
§ 371 (c)(1),
(2) Date: Jan. 6, 2017

(87) PCT Pub. No.: WO2017/049824
PCT Pub. Date: Mar. 30, 2017

(65) Prior Publication Data
US 2017/0301700 A1    Oct. 19, 2017

(30) Foreign Application Priority Data
Sep. 21, 2015 (CN) .......................... 2015 1 0605434

(51) Int. Cl.
  H01L 27/12           (2006.01)

(52) U.S. Cl.
  CPC ........ *H01L 27/1244* (2013.01); *H01L 27/127* (2013.01); *H01L 27/1288* (2013.01)

(58) Field of Classification Search
None
See application file for complete search history.

(56) References Cited

U.S. PATENT DOCUMENTS 4,783,385 A * 11/1988 Duesdieker ............... G03F 3/06
                                                               430/293
5,371,398 A * 12/1994 Nishihara ......... G02F 1/136209
                                                               257/435

(Continued)

FOREIGN PATENT DOCUMENTS

CN        101105615 A      1/2008
CN        101350330 A      1/2009

(Continued)

OTHER PUBLICATIONS

International Search Report and Written Opinion from PCT Application Serial No. PCT/CN2016/072292, dated Jun. 27, 2016, 12 pages.

(Continued)

*Primary Examiner* — Kimberly Rizkallah
*Assistant Examiner* — Bo Bin Jang
(74) *Attorney, Agent, or Firm* — Kinney & Lange, P.A.

(57) ABSTRACT

The present disclosure provides a method for producing a TFT array substrate, a TFT array substrate, and a display apparatus, and relates to a technical field of display. It can solve a problem of no signal transmission caused by fracture of a source signal line, without increasing a coupling capacitance of the TFT array substrate. The method for producing a TFT array substrate includes: forming a transparent conductive layer and a source-drain metal layer in sequence onto a base substrate; and patterning the source-drain metal layer and the transparent conductive layer in one patterning (Continued)

process to form a source signal line and a pixel electrode line overlapping with each other.

14 Claims, 3 Drawing Sheets

(56) References Cited

U.S. PATENT DOCUMENTS

| | | | |
|---|---|---|---|
| 8,330,916 B2 | 12/2012 | Lee et al. | |
| 2004/0180480 A1 | 9/2004 | Dejima | |
| 2007/0246707 A1* | 10/2007 | Deng | G02F 1/1362 257/57 |
| 2008/0079001 A1* | 4/2008 | Umezaki | H01L 27/12 257/59 |
| 2014/0061615 A1* | 3/2014 | Zhang | H01L 51/10 257/40 |

FOREIGN PATENT DOCUMENTS

| | | |
|---|---|---|
| CN | 102709237 A | 10/2012 |
| CN | 102779785 A | 11/2012 |
| CN | 105140181 A | 12/2015 |

OTHER PUBLICATIONS

First Chinese Office Action, for Chinese Patent Application No. 201510605434.9, dated Jul. 18, 2017, 11 pages.

* cited by examiner

METHOD FOR PRODUCING TFT ARRAY SUBSTRATE, TFT ARRAY SUBSTRATE, AND DISPLAY APPARATUS

CROSS-REFERENCE TO RELATED APPLICATION

This application is a Section 371 National Stage Application of International Application No. PCT/CN2016/072292, filed on Jan. 27, 2016, entitled "METHOD FOR PRODUCING TFT ARRAY SUBSTRATE, TFT ARRAY SUBSTRATE, AND DISPLAY APPARATUS", which has not yet published, and which claims priority to Chinese Application No. 201510605434.9, filed on Sep. 21, 2015, incorporated herein by reference in their entirety.

BACKGROUND OF THE DISCLOSURE

Field of the Disclosure

The present disclosure relates to a technical field of display, more particularly, to a method for producing a TFT (Thin Film Transistor) array substrate, a TFT array substrate, and a display apparatus.

Description of the Related Art

A TFT array substrate is an important integral part of a display apparatus. The TFT array substrate normally includes a base substrate, and a gate electrode, a gate protection layer, an active layer, a pixel electrode, a source electrode, a drain electrode, a source signal line and a source-drain protection layer disposed on the base substrate. The pixel electrode is formed by a transparent conductive layer via a patterning process, the source electrode, the drain electrode and the source-drain signal line are formed by a source-drain metal layer via a patterning process, and the transparent conductive layer is located below the source-drain metal layer.

Due to influences caused by factors such as a preceding process and a following process of the patterning process for the source-drain metal layer, and non-uniformity of coating of photoresist in the patterning process of the source-drain metal layer, the source-drain signal line tends to be fractured, resulting in no signal transmission. As shown in FIG. 1, in order to solve the problem in the prior art that the signal cannot be transmitted due to the fracture of the drain signal line 4, the pixel electrode 3' and a pixel electrode line 3 are synchronously formed in the patterning process of the transparent conductive layer. The pixel electrode line 3 is located at a position where the source signal line is to be formed, so that the source signal line 4 formed subsequently will overlap with the pixel electrode line 3. When the source signal line 4 is fractured, the signal can be conducted by means of the pixel electrode line 3 below the fractured source signal line 4.

However, in an actual application of the above improved technical solution, this will cause the coupling capacitance of the TFT array substrate to increase, resulting in increase of power consumption of the TFT array substrate.

SUMMARY

In order to at least partially alleviate the defects and/or deficiency in the prior art, the present application provides a method for producing a TFT array substrate, a TFT array substrate, and a display apparatus, which can solve the problem that no signal transmission is performed due to the fracture of the source signal line without increasing the coupling capacitance of the TFT array substrate.

In order to achieve the above object, the following technical solutions of the present application will be adopted:

In a first aspect of the present application, it provides a method for producing a TFT array substrate, including:

forming a transparent conductive layer and a source-drain metal layer in sequence onto a base substrate; and patterning the source-drain metal layer and the transparent conductive layer in one patterning process to form a source signal line and a pixel electrode line overlapping with each other.

In the method for producing the TFT array substrate, the source signal line is overlapped with the pixel electrode line. When the source signal line is fractured, the signal can be conducted by the pixel electrode line below the fractured source signal line. Furthermore, the source signal line and the pixel electrode line are formed by the same one patterning process, thus no alignment deviation is present between the source signal line and the pixel electrode line, and both of them can exactly overlap with each other and have no misplacement. In this way, the width of the source signal line is still of its own original width. This would not increase the distance between the source signal line and the pixel electrode. The coupling capacitance between the source signal line and the pixel electrode would not be increased.

In a second aspect of the present application, it provides a TFT array substrate, wherein the TFT array substrate includes a pixel electrode line and a source signal line overlapping with each other, which are formed by a same one patterning process. Because in the TFT array substrate, the source signal line is overlapped with the pixel electrode line, and they are formed by the same one patterning process, it can solve the problem of no signal transmission caused by the fracture of the source signal line, without increasing the coupling capacitance thereof.

In a third aspect of the present application, it provides a display apparatus, including the TFT array substrate as described in the second aspect of the present application.

Because the display apparatus includes the TFT array substrate as described in the second aspect of the present application, it can possess the same advantageous effect as that of the TFT array substrate, which will be omitted herein.

BRIEF DESCRIPTION OF THE DRAWINGS

In order to make technical solutions of embodiments of the present disclosure or in the prior art become clear, the drawings used in the embodiments or in the prior art are briefly discussed. It is obvious that the drawings in the followings are only referred to some embodiments of the present disclosure, and thus the person skilled in the art can obtain other drawings based on the above drawings without any creative efforts.

Figure 1:
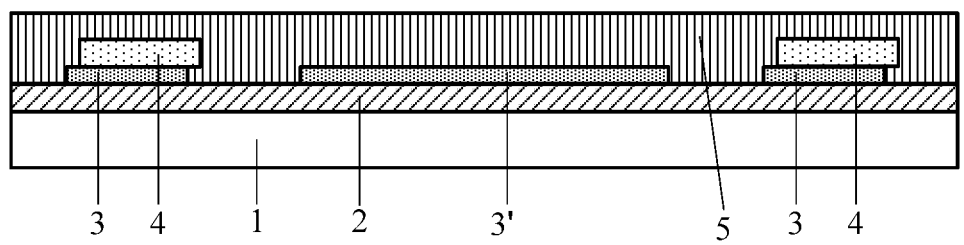
FIG. 1 is a cross-section view of a TFT array substrate in the prior art.

EXPLANATION ABOUT REFERENCE SIGNS 1-base substrate 2-gate protection layer 3-pixel electrode line 3'-pixel electrode 30-transparent conductive layer 4-source signal line 4'-source-drain metal layer covering the pixel electrode
40-source-drain metal layer
5-source-drain protection layer 60-photoresist 61-first photoresist layer
62-second photoresist layer 70-reticle 71-full transparent pattern
72-partially transparent pattern 73-light shielding pattern

DETAINED DESCRIPTION OF PREFERRED EMBODIMENTS OF THE DISCLOSURE

As described in the background part, the technical solution in the prior art that the pixel electrode line 3 is disposed below the source signal line 4, cannot well solve the problem of no signal transmission caused by the fracture of the source signal line 4. Through amount of research and experiments, it is found that the main reason for the above problem is the pixel electrode line 3 and the source signal line 4 respectively formed in two patterning processes. In the patterning process of the source-drain metal layer, it is necessary for the reticle to align with the pixel electrode line 3. Due to limitation of the patterning process, it tends to generate deviation upon aligning. This causes the formed source signal line 4 not to overlap the pixel electrode line 3 exactly, and there is misplacement between them. This will be equivalent to increasing a width of the source signal line 4, thereby causing reduction of a spacing between the source signal line 4 and the pixel electrode 3'. As the magnitude of the capacitance is inversely proportional to the spacing between the two electrode boards, thus the spacing between the source signal line 4 and the pixel electrode 3' is reduced. This will result in an increase of the coupling capacitance between the source signal line 4 and the pixel electrode 3', thereby causing the increase of power consumption of the TFT array substrate.

On this basis, a method for producing a TFT array substrate is proposed, including the steps of:

Step S1, forming a transparent conductive layer and a source-drain metal layer onto a base substrate in sequence;

Step S2, patterning the source-drain metal layer and the transparent conductive layer in one patterning process to form a source signal line and a pixel electrode line overlapping with each other.

In the method for producing the TFT array substrate, the source signal line is overlapped with the pixel electrode line. When the source signal line is fractured, the signal can be conducted by the pixel electrode line 3 below the fractured source signal line. Furthermore, the source signal line and the pixel electrode line are formed by the same one patterning process, thus, no alignment deviation is present between the source signal line and the pixel electrode line, and both of them can exactly overlap with each other and have no misplacement. This would not increase the width of the source signal line, and would not reduce the distance between the source signal line and the pixel electrode. The coupling capacitance between the source signal line and the pixel electrode would not be increased, thereby not increasing the power consumption of the TFT array substrate.

In order that objectives, characteristics and advantages of technical solutions in accordance with embodiments of the present application become more clear, the technical solutions of the present embodiments are clearly and completely described with reference to figures related to the embodiments. It is obvious that the described embodiments are only a part of the embodiments of the present application, rather than all of the embodiments. On the basis of the embodiments of the present application, other embodiments which are obtained by the person skilled in the art without any creative efforts, will also fall within the scope of the present application.

Figure 2:
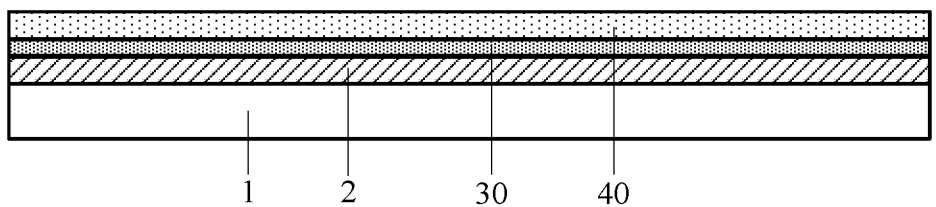
FIGS. 2-9 are views for showing respective steps of a method for producing a TFT array substrate in accordance with an embodiment of the present disclosure.

With reference to FIG. 2, Step S1 is to form a transparent conductive layer 30 and a source-drain metal layer 40 in sequence onto a base substrate 1. The transparent conductive layer 30 may be made of a metal oxide transparent conductive material, for example ITO (Indium Tin Oxide). The transparent conductive layer 30 and the source-drain metal layer 40 can be formed by a sputtering process.

It should be noted that before the Step S1, the method for producing the TFT array substrate in accordance with the embodiment of the present application, further includes a step of forming a gate electrode, a gate protection layer and an active layer, which can be specified as: forming a gate metal layer on the base substrate, patterning the gate metal layer to form the gate electrode; forming a gate protection layer 2 (as shown in FIG. 2) on the base substrate formed with the gate electrode; forming a semiconductor layer on the gate protection layer 2, patterning the semiconductor layer to form the active layer.

Figure 3:
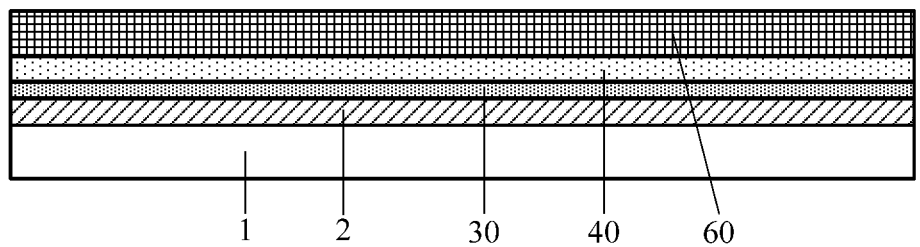

With reference to FIGS. 3-8, the Step S2 includes the following steps:

Step 21: as shown in FIG. 3, coating photoresist 60 onto the source-drain metal layer 40;

The photoresist 60 can be coated by a spin-coating process, and is optionally selected to be of highly adhesive, good uniformity, and high sensitivity to light. The photoresist 60 can be positive, and become soluble substance after exposure to light. Alternatively, the photoresist can be negative, and become non-soluble substance after exposure to light. In the present embodiment, the explanation is made taking the negative photoresist 60 as one example.

Figure 4:
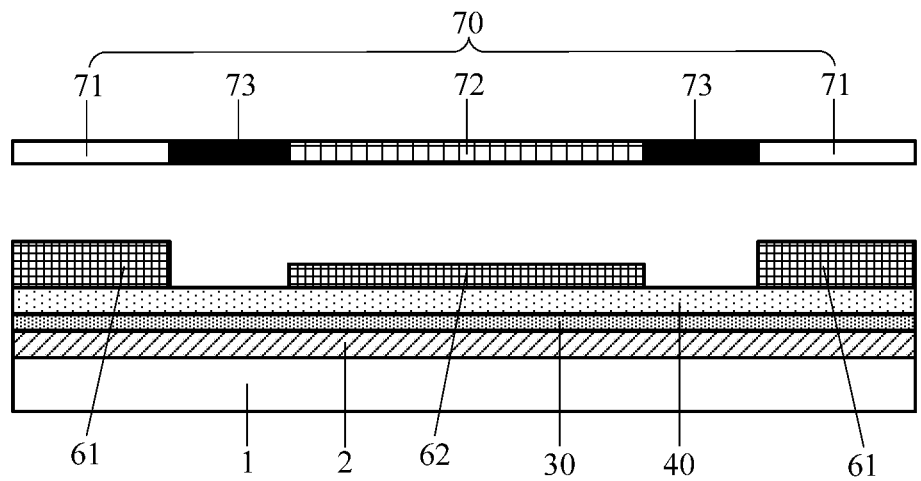

Step S22, as shown in FIG. 4, the coated photoresist 60 is exposed to light by means of a reticle 70 having a full transparent pattern 71, a partially transparent pattern 72 and a light shielding pattern 73, thereby forming a first photoresist layer 61 covering a region where the source signal line is to be formed and a second photoresist layer 62 covering a region where the pixel electrode is to be formed. The first photoresist layer 61 has a thickness larger than that of the second photoresist layer 62.

In a case that the photoresist 60 is negative, before the exposing, the full transparent pattern 71 of the reticle 70 shall be aligned with the region where the source signal line is to be formed, and with the region where the source electrode is to be formed and the region where the drain electrode is to be formed. The partially transparent pattern 72 shall be aligned with the region where the pixel electrode is to be formed. The light shielding pattern 73 shall be aligned with other regions except those where the source signal line, the source electrode, the drain electrode and the pixel electrode are to be formed. After the exposure step, the photoresist in the region where the source signal line is to be formed and the region where the source and drain electrodes are to be formed becomes non-soluble, thereby being fully conserved and forming the first photoresist layer 61. Therefore, the first photoresist layer 61 covers the region where the source signal line is to be formed, and the region where the source and drain electrodes are to be formed. In addition, the photoresist in the region where the pixel electrode is to be formed becomes partially soluble, thereby being partially conserved, and forming the second photoresist layer 62. The photoresist in the other regions except the regions where the source signal line, the source and drain electrodes, and the pixel electrode are to be formed, all becomes soluble, thereby being fully removed.

The partially transparent pattern 72 as described above can be half transparent.

Figure 5:
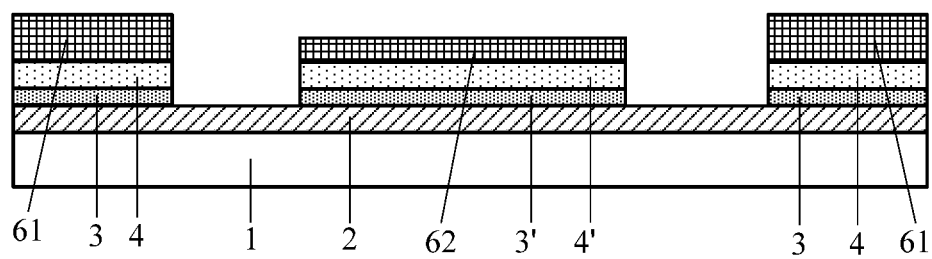

Step S23: as shown in FIG. 5, taking the first photoresist layer 61 and the second photoresist layer 62 as a mask, parts of the source-drain metal layer and the transparent conductive layer which are not covered by the photoresist are removed, thereby forming a source signal line 4 and a pixel electrode line 3 overlapping with each other in the region where the source signal line is to be formed, and forming a pixel electrode 3' in the region where the pixel electrode is to be formed. The pixel electrode 3' is covered by the source-drain metal layer, for example, covered by the source-drain metal layer 4' as shown in FIG. 5.

In the step S23, the source-drain metal layer and the transparent conductive layer which are not covered by the photoresist can be removed by a wet etching process.

Because the source signal line 4 is overlapped with the pixel electrode line 3, when the source signal line 4 is fractured, the pixel electrode 3 overlapped with the source signal line 4 is capable of well electrically connecting the two fractured ends of the source signal line 4, thereby ensuring successful conduction of signal. Further, since the source signal line 4 and the pixel electrode line 3 are formed in the same patterning process, they can be exactly overlapped with each other and have no misplacement therebetween. Due to no increase of the width of the source signal line 4, the distance between the source signal line 4 and the pixel electrode 3' is not reduced. The coupling capacitance between them is not increased and thus the power consumption of the TFT array substrate is not raised.

It should be noted that in the Step S23, the source and drain electrodes are formed while the source signal line 4 is formed; and the pixel electrode 3' and the pixel electrode line 3 are formed at the same time. Therefore, it can be seen that the source-drain metal layer and the transparent conductive layer are formed at the same one patterning process, thereby saving up the number of the patterning process, simplifying the producing steps and beneficially improving the performance of the TFT array substrate.

Figure 6:
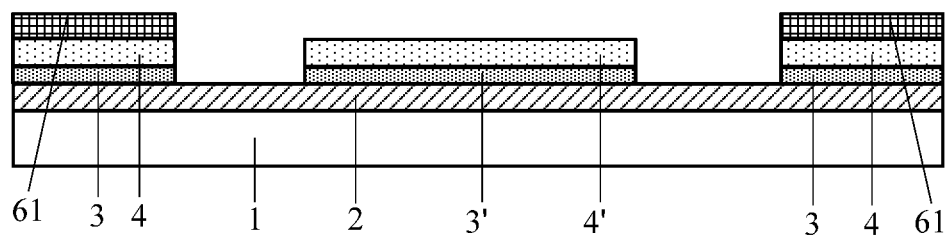

Step S24, as shown in FIG. 6, removing the second photoresist layer 62 so that the source-drain metal layer 4' covering the pixel electrode is exposed.

In the step S24, the second photoresist layer 62 can be removed by an ashing process. Because the first photoresist layer 61 has the thickness larger than that of the second photoresist layer 62, the first photoresist layer 61 still has a certain thickness after the second photoresist layer 62 is fully removed by the ashing process.

Figure 7:
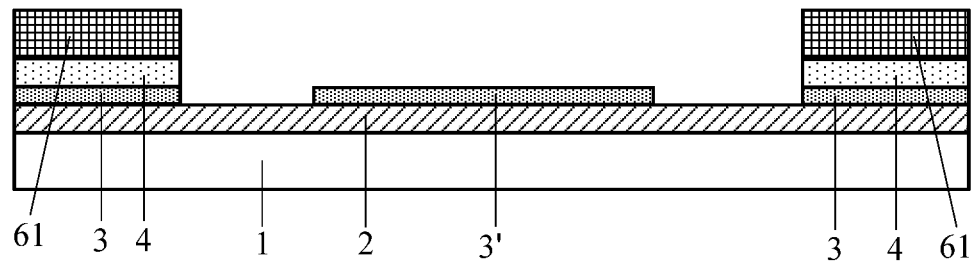

Step S25, as shown in FIG. 7, taking the first photoresist layer 61 as a mask, removing the exposed source-drain metal layer 4'.

In the step S25, the exposed source-drain metal layer 4' is removed by a wet etching process.

Figure 8:
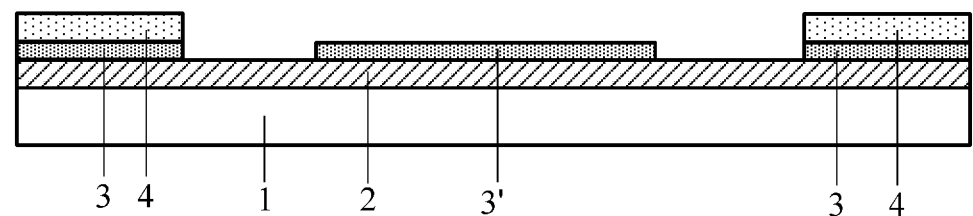

Step S26, as shown in FIG. 8, removing the first photoresist layer 61.

In the step S26, the first photoresist layer 61 can be removed by a peeling-off process.

Figure 9:
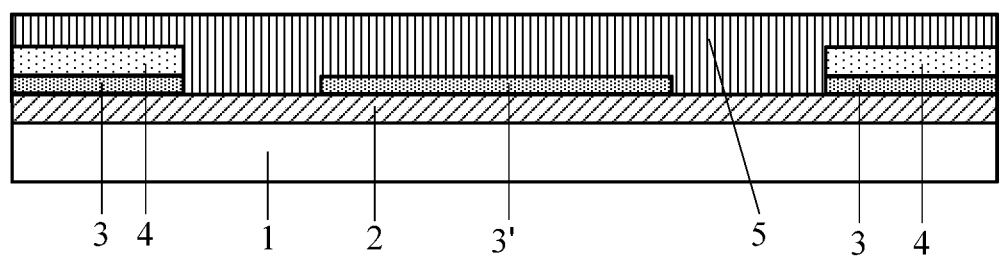

After the step S26, as shown in FIG. 9, a source-drain protection layer 5 is formed on such base substrate, so as to protect the pixel electrode 3', the source metal line 4, and the source and drain electrodes below it, and to electrically insulate them from the subsequently formed films or elements. In addition, after forming the source-drain protection layer 5, a common electrode is also formed on the source-drain protection layer 5, so as to form an electric field with the pixel electrode 3'.

Another embodiment of the present application also provides a TFT array substrate. As shown in FIG. 9, the TFT array substrate includes the pixel electrode line 3 and the source signal line 4 overlapping with each other, which are formed at the same one patterning process.

Because the source signal line 4 is overlapped with the pixel electrode line 3, when the source signal line 4 is fractured, the pixel electrode 3 below the source signal line 4 is capable of well electrically connecting the two fractured ends of the source signal line 4, thereby ensuring successful conduction of signal. Further, since the source signal line 4 and the pixel electrode line 3 of the TFT array substrate are formed in the same patterning process, it can avoid the problem of the alignment error caused by the method that the pixel electrode line 3 and the source signal line 4 are separately formed by two patterning processes, so that they can be exactly overlapped with each other and have no misplacement therebetween. Due to no increase of the width of the source signal line 4, the distance between the source signal line 4 and the pixel electrode 3' is not reduced. The coupling capacitance between them is not increased and thus the power consumption of the TFT array substrate is not raised.

The above TFT array substrate further includes a pixel electrode 3', which is formed by the same one patterning process as that of the pixel electrode line 3 and the source signal line 4. In addition, the source and drain electrodes are also formed by the same one patterning process as that of the pixel electrode 3', the pixel electrode line 3 and the source signal line 4. Therefore, it can be seen that the pixel electrode 3', the pixel electrode line 3, the source signal line 4, and the source and drain electrodes are formed by the same one patterning process, thereby saving up the number of the patterning process, and beneficially improving the performance of the TFT array substrate.

A further embodiment of the present application also provides a display apparatus, which includes the TFT array substrate as described above. This kind of the TFT array substrate can solve the problem of no signal transmission caused by the fracture of the source signal line, without increasing the coupling capacitance of the TFT array substrate. Therefore, the display apparatus in accordance with the present embodiment not only can display with no effects from the fracture of the source signal line, but also can have a relatively small coupling capacitance.

It should be noted that the display apparatus in accordance with the present embodiment can be of liquid crystal type, OLED (Organic Light-Emitting Diode) type, or electronic paper type, which is applicable to any products or components having the displaying function, such as a mobile phone, a tablet computer, TV, a displayer, a notebook computer, a digital photo frame, or a navigator.

The above described embodiments are a part of embodiments of the present application, rather than to limit the scope of the present application. As for those skilled in the art, any modification or replacement shall be considered within the scope of the present invention, based on the disclosure of the present invention. Therefore, the protection scope of the present application shall be defined by the appended claims.

What is claimed is:

1. A method for producing a TFT array substrate, the method comprising:
   forming a transparent conductive layer and a source-drain metal layer in sequence onto a base substrate; and
   patterning the source-drain metal layer and the transparent conductive layer in one patterning process to form a source signal line and a pixel electrode line overlapping with each other, wherein the source signal line is located only on the pixel electrode line;

wherein the step of patterning the source-drain metal layer and the transparent conductive layer in one patterning process to form a source signal line and a pixel electrode line overlapping with each other comprises:

coating photoresist onto the source-drain metal layer;

exposing the coated photoresist through a reticle having a full transparent pattern, a partially transparent pattern and a light shielding pattern, thereby forming a first photoresist layer covering a region where the source signal line is to be formed and a second photoresist layer covering a region where a pixel electrode is to be formed, wherein the first photoresist layer has a thickness larger than that of the second photoresist layer;

removing parts of the source-drain metal layer and the transparent conductive layer which are not covered by the first photoresist layer or the second photoresist layer, by means of taking the first photoresist layer and the second photoresist layer as a mask, thereby forming the source signal line and the pixel electrode line overlapping with each other in the region where the source signal line is to be formed, and forming the pixel electrode in the region where the pixel electrode is to be formed, wherein the pixel electrode is covered by a remaining portion of the source-drain metal layer;

removing the second photoresist layer so that the remaining portion of the source-drain metal layer covering the pixel electrode is exposed;

removing the exposed remaining portion of the source-drain metal layer by means of taking the first photoresist layer as a mask; and removing the first photoresist layer; and wherein before forming the transparent conductive layer, the method further comprises:

forming a gate metal layer on the base substrate, and patterning the gate metal layer to form a gate electrode;

forming a gate protection layer on the base substrate provided with the gate electrode; and forming a semiconductor layer on the gate protection layer, and patterning the semiconductor layer to form an active layer.

2. The method according to claim 1, wherein the first photoresist layer also covers a region where a source electrode is to be formed and a region where a drain electrode is to be formed.

3. The method according to claim 2, wherein the step of forming the transparent conductive layer and the source-drain metal layer is performed by a sputtering process.

4. The method according to claim 1, wherein the partially transparent pattern of the reticle is half transparent.

5. The method according to claim 1, wherein the step of removing parts of the source-drain metal layer and the transparent conductive layer which are not covered by the first photoresist layer or the second photoresist layer comprises:

removing the parts of the source-drain metal layer and the transparent conductive layer which are not covered by the photoresist by a wet etching process.

6. The method according to claim 5, wherein the step of removing the second photoresist layer comprises:

removing the second photoresist layer by an ashing process.

7. The method according to claim 6, wherein the step of removing the exposed remaining portion of the source-drain metal layer comprises:

removing the exposed remaining portion of the source-drain metal layer by a wet etching process.

8. The method according to claim 7, wherein the step of removing the first photoresist layer comprises:

removing the first photoresist layer by a peeling-off process.

9. The method according to claim 1, wherein the step of forming the transparent conductive layer and the source-drain metal layer is performed by a sputtering process.

10. The method according to claim 1, wherein before forming the transparent conductive layer, the method further comprises:

forming a gate metal layer on the base substrate, and patterning the gate metal layer to form a gate electrode;

forming a gate protection layer on the base substrate provided with the gate electrode;

forming a semiconductor layer on the gate protection layer, and patterning the semiconductor layer to form an active layer.

11. A TFT array substrate produced by the method according to claim 1, wherein the TFT array substrate comprises the pixel electrode line and the source signal line overlapping with each other, which are formed by a same one patterning process.

12. The TFT array substrate according to claim 11, wherein the TFT array substrate further comprises the pixel electrode, and the pixel electrode, the pixel electrode line and the source signal line are formed by the same one patterning process.

13. A display apparatus, comprising the TFT array substrate according to claim 11.

14. A display apparatus, comprising the TFT array substrate according to claim 12.

* * * * *